(12) United States Patent
Schwarz et al.

(10) Patent No.: US 9,004,303 B2
(45) Date of Patent: Apr. 14, 2015

(54) HOUSING FOR ELECTRICAL OPERATING MEANS

(75) Inventors: Gerhard Schwarz, Schönbrunn (DE); Reiner Naumann, Mannheim (DE)

(73) Assignee: Cooper Crouse-Hinds GmbH, Soest (DE)

( * ) Notice: Subject to any disclaimer, the term of this patent is extended or adjusted under 35 U.S.C. 154(b) by 327 days.

(21) Appl. No.: 12/601,297

(22) PCT Filed: Feb. 22, 2008

(86) PCT No.: PCT/EP2008/001440
§ 371 (c)(1),
(2), (4) Date: Apr. 15, 2010

(87) PCT Pub. No.: WO2008/145205
PCT Pub. Date: Dec. 4, 2008

(65) Prior Publication Data
US 2010/0202103 A1    Aug. 12, 2010

(30) Foreign Application Priority Data
May 25, 2007    (DE) .......................... 10 2007 024 421

(51) Int. Cl.
B65D 6/28    (2006.01)
H02K 5/136    (2006.01)
H05K 5/06    (2006.01)

(52) U.S. Cl.
CPC ................ *H02K 5/136* (2013.01); *H05K 5/063* (2013.01)

(58) Field of Classification Search
USPC ............. 220/4.02, 3.2, 3.8, 88.1; 361/679.01; 174/17 CT; 218/155
See application file for complete search history.

(56) References Cited

U.S. PATENT DOCUMENTS 3,675,007 A * 7/1972 Appleton et al. ............. 362/363
3,775,551 A * 11/1973 Prehmus et al. ............. 174/542

(Continued)

FOREIGN PATENT DOCUMENTS

| DE | 2112224 | 4/1981 |
| DE | 19634671 | 8/1998 |
| DE | 19634673 | 8/1998 |
| DE | 19826911 | 1/2000 |
| EP | 0777407 | 6/1997 |
| RU | 2259512 | 8/2005 |

OTHER PUBLICATIONS

Aubry, Sandrine, Written Opinion of the International Searching Authority for PCT/EP2008/001440, pp. 1-11.
CENELEC, European Standard, Mar. 2004, 18 pages, EN 60079-1.
Underwriters Laboratories Inc. (UL), UL Standard for Safety for Explosion-Proof and Dust-Ignition-Proof Electrical Equipment for Use in Hazardous (Classified) Locations, Sep. 15, 2006, 48 pages, UL 1203, Underwriters Laboratories Inc., Northbrook, IL.

*Primary Examiner* — Jeffrey Allen
(74) *Attorney, Agent, or Firm* — King & Spalding LLP

(57) ABSTRACT

The invention relates to a housing (1) for an electrical operating means such as a light, plug-in device, measuring instrument, switch, distributor, or the like, having at least one first and one second housing part (2,3) that can be assembled with one another in an explosion-proof fashion. Each housing part has one joining surface (4,5); when the housing parts are assembled, said joining surfaces are in contact with one another, forming a penetration-proof gap (6). In order to provide a novel structure of joining surfaces by means of which a corresponding penetration-proof gap is formed independently of the cross-sectional shape of the housing parts and to be able to substantially unite the advantages of both joining surfaces and the housing mentioned above, the joining surfaces run substantially perpendicular relative to the rest of the housing parts and surface profiles (7, 8) are formed in said joining surfaces, the penetration-proof gap being formed between said surface profiles.

15 Claims, 2 Drawing Sheets

(56) References Cited

U.S. PATENT DOCUMENTS

| | | | | |
|---|---|---|---|---|
| 4,620,061 A | * | 10/1986 | Appleton | 174/51 |
| 5,391,837 A | * | 2/1995 | Carey | 174/50 |
| 5,621,189 A | * | 4/1997 | Dodds | 174/50 |
| 6,372,983 B1 | * | 4/2002 | Knaggs | 174/17 LF |
| 6,392,322 B1 | | 5/2002 | Mares et al. | 310/88 |
| 2005/0029881 A1 | | 2/2005 | Preston | 310/88 |
| 2007/0159018 A1 | | 7/2007 | Martin et al. | 310/88 |

* cited by examiner

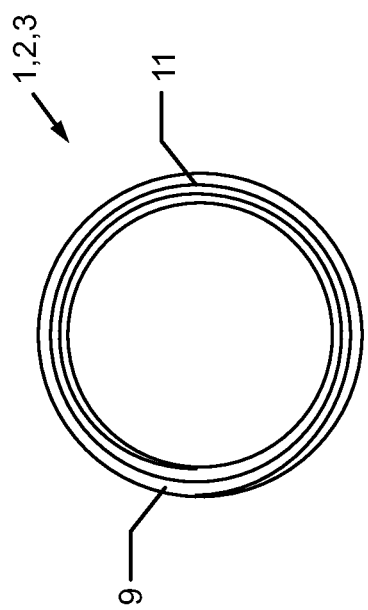

HOUSING FOR ELECTRICAL OPERATING MEANS

The invention relates to a housing for electrical operating media, such as a lighting fixture, a plug-in device, a measuring instrument, switching mechanisms, distributors or the like. The housing comprises at least one first and one second housing part which can be assembled in an explosion-proof fashion, wherein each housing part has a joining surface which, when the housing parts are assembled, are in contact with each other by forming a penetration-proof gap.

Such housing parts are employed for the most various electrical operating media in explosion-hazardous areas. In order to realize joining surfaces the flame-proof gap has, as a rule, a certain length and a certain gap width. Corresponding requirements as to explosion protection are specified, for example, in the ATEX Directive 94/9/EC. The electrical operating media are subdivided into device groups I and II. Device group II includes any electrical operating media for explosion-hazardous areas, except for firedamp underground works. Device group II is subdivided into A, B and C, wherein the operating media according to device group C are located in atmospheres that are easiest to ignite and are, therefore, also suited for use for device groups II A and B.

For electrical operating media in housings which have an angular cross-section particularly flat joining surfaces are used, which contact each other with their flat faces when the housing parts are assembled. The respective flame-proof gap is defined between these flat faces. The housing parts may be fixed to each other in the region of the joining surfaces or also at another point.

Angular housings have the advantage that the electrical operating media arranged in the same are, as a rule, easier accessible than, for example, those arranged in housings that have a circular cross-section. As a rule, the respective joining surfaces of such housings having a circular cross-section are formed as threaded surfaces which extend in the longitudinal direction of the housing parts, so that the two housing parts can be screwed together by means of these threaded surfaces. In this case, the penetration-proof gap is defined between the threaded surfaces.

The invention is based on the object to provide a novel structure for joining surfaces, by means of which a corresponding penetration-proof gap is formed in a simple constructive manner regardless of the cross-sectional shape of the housing parts, and which substantially unites the advantages of the two aforementioned joining surfaces and the housing. Specifically, the housing according to the invention may also be employed for device groups II C.

This object is achieved with a housing comprising the features of patent claim 1. The housing according to the invention is particularly characterized in that the joining surfaces extend substantially perpendicular relative to the rest of the housing parts and that a surface profile in the form of a corrugation, in the form of teeth or spikes or the like is formed in these joining surfaces.

According to the invention these surface profiles simply engage each other during the assembly of the two housing parts, which substantially corresponds to the above-described flat joining surfaces contacting each other. However, the inventive surface profile of the joining surfaces permits the realization of these joining surfaces with smaller dimensions, without leading to a shortening of the flame-proof gap because the length thereof is increased by the corresponding surface profile, even if the joining surfaces are of a smaller dimension. However, as the corresponding surface profiles do not serve a screw engagement, but are engaged with each other only by the contact of the respective joining surfaces, for example, no rotation of the housing parts relative to each other is necessary, so that there are no limitations either with respect to the cross-section of the housing parts, e.g. circular cross-sections.

Also, it is possible to arrange the respective joining surfaces in an inclined fashion, i.e. at an angle not equal to 90°, relative to the rest of the housing parts. In this connection it is an advantage, however, if the inclinations of the respective joining surfaces of the housing parts are complementary with respect to each other so that, for example, with an inclination of 120° relative to the longitudinal direction of the one housing part the inclination of the joining surface of the other housing part makes 60° in the corresponding direction.

However, in order to simplify the production of the corresponding joining surfaces a substantially perpendicular orientation relative to the rest of the housing parts is more favorable.

It is possible that the corresponding surface profile extends, for example, only partially in the direction of the joining surfaces, whereby the joining surfaces may be formed as part of a flange surface which projects from the housing part in a substantially radially outward manner. Outside the surface profile this flange surface may also have flat areas or areas with different structures.

To allow a corresponding explosion protection around the circumference of the corresponding housing part, and without any other means, the joining surface surrounding the housing part may be provided with a corresponding surface profile.

As was already substantially stated before, the housing part can, according to the invention, have a circular or angular cross-section. Preferred angular cross-sections are quadrangular, namely square or rectangular cross-sections.

Regarding the joining surfaces and the surface profiles, basically, there are no limitations with respect to the corresponding material so that it is possible to use the materials that are typically used for explosion-proof housings. For example, the housing part may be produced of a metal, specifically of light metal, at least in the region of the joining surface. Such a metal is aluminum, brass or also sheet steel. Of course, it is possible to produce not only the corresponding joining surface with the surface profile of this material, but the entire housing part.

Another possibility is the production of the housing part, at least in the region of the joining surface, of a plastic material. Examples for such plastic materials are thermoplastics, and specifically polyamide, polycarbonate and also polyester. Here, too, it is possible to produce the entire housing part of this material.

Moreover, it is possible that the first and the second housing part are produced of different materials, at least in the region of the joining surfaces.

If a housing part is made of metal it may be favorable if the housing part has at least one coating specifically of a plastic material. An example for such a coating of a plastic material is polyester, PTFE (polytetrafluoroethylene) or also an anodization of the metal.

To allow an easy production of the entire housing part, the housing part with the joining surface can be produced from a casting.

In this connection it is, moreover, possible that the surface profile can be produced simultaneously during the casting of the housing part. Such a casting can be, for example, die-casting or injection molding.

Also, it is possible that the surface profile is produced subsequently, specifically by machining the joining surfaces, after the corresponding housing part with the joining surface is produced.

It had already been pointed out that the surface profile can extend around the housing part in the profile direction, whereby the surface profile may be composed of substantially circular or also angular individual profiles in the profile direction. With such circular individual profiles the entire surface profile of the corresponding joining surfaces is formed by individual profiles which are arranged concentrically relative to each other. This applies analogously also to the angular individual profiles, which are used specifically also for corresponding housing parts with an angular cross-section. Such angular individual profiles may abut each other and merge with each other in the corners of the housing part, depending on the cross-section of the same.

Also, it is possible that the surface profile is spiral-shaped, which may be favorable specifically for housing parts that have a circular cross-section.

Both in the profile direction and perpendicular to the same the surface profile may have the same profile depth and/or profile height. This means that, for example in the profile direction, an individual profile has a constant profile depth or profile height relative to the rest of the joining surface. However, it is also possible that the profile depth or profile height changes in this direction, wherein such a change may take place continuously or also discontinuously. This applies analogously also to the surface profile in the direction perpendicular to the profile direction. This means that, for example, different individual profiles which are arranged side by side have different profile depths or profile heights. Also a combination of the two aforementioned possibilities is feasible.

In order to simplify the production of the corresponding surface profiles and, at the same time, favorably predetermine the gap dimension the two surface profiles of the housing parts, which engage each other, may formed to be complementary with respect to each other.

In order to be able to easily connect the corresponding housing parts to each other they may be connected to each other detachably in the region of the joining surfaces, specifically outside the surface profiles. Such a connection may be accomplished by means of screws or the like.

Moreover, it is possible that the surface profile is formed to be projecting and/or recessed relative to the rest of the joining surface. Here, it is also possible that the corresponding profile crests each project above the rest of the joining surface, while corresponding profile recesses are arranged recessed relative to the rest of the joining surface. Also, it is possible that the profile crests end flush with the rest of the joining surface and the profile recesses are recessed in this joining surface.

Other combinations are possible.

The invention will be explained in more detail below by means of the figures illustrated in the drawing.

Figure 1:
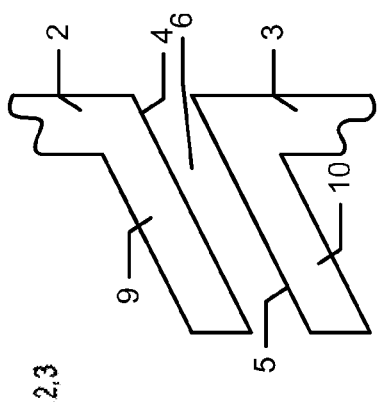
FIG. 1 shows a top view of a housing having a circular cross-section.
Figure 2:
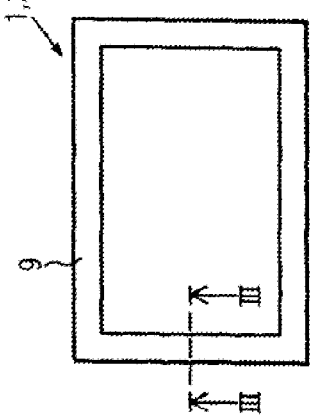
FIG. 2 shows a top view of a housing having a rectangular cross-section.
Figure 6:
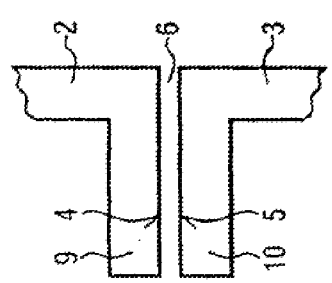
Figure 4:
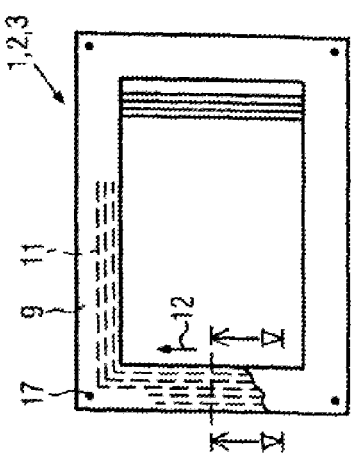
Figure 5:
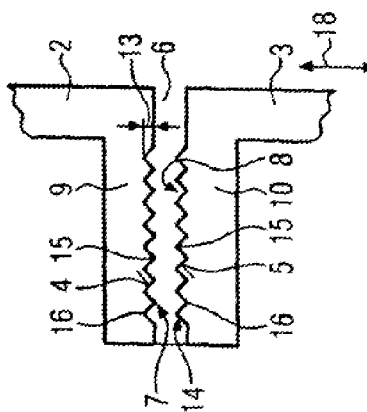

FIG. 4 shows a top view of a housing having a rectangular cross-section according to an embodiment of the invention, FIG. 5 shows a section along line V-V of FIG. 4, FIG. 6 shows a section of an alternative embodiment along line III-III of FIG. 1 or FIG. 2, FIG. 7 shows a top view of a housing having a circular cross-section and a spiral-shaped surface profile according to another embodiment of the invention, and At this place it be pointed out once more that the corresponding section according to FIG. 5 may also be provided in FIG. 1, see intersection line III-III. According to the invention the surface profile is not limited to angular or round housings.

FIG. 1 shows a top view of a housing 1 comprised of a first and second housing part 2, 3 which have a circular cross-section. Inside the housing an electrical operating medium may be located, e.g. a lighting fixture, a plug-in device, a measuring instrument, a switching mechanism, a distributor or the like. Corresponding lighting fixtures are, for example, portable lights, a rod lamp, a hand lamp, a cap lamp, a linear fluorescent luminary or the like. Moreover, such a housing can also be used for junction boxes, line entrances, push buttons, safety switches, field distribution or the like.

Figure 3:
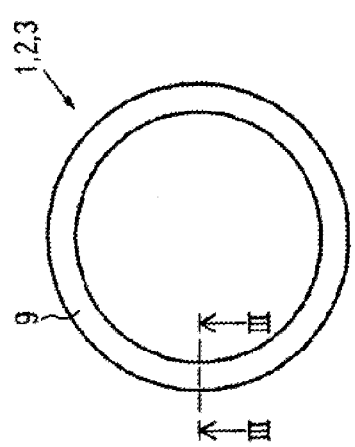
FIG. 3 shows a section along line III-III of FIG. 1 or FIG. 2.

Another housing shape is shown in FIG. 2, which only differs from the housing according to FIG. 1 by the cross-section. In FIG. 2 the housing has an angular, specifically a rectangular cross-section. In the region of flange surfaces 9 which surround the housing 1, also see FIG. 3, a flame-proof gap 6 is formed. FIG. 3 corresponds to a section along line III-III both of FIG. 1 and FIG. 2.

In FIG. 3 the two housing parts 2 and 3 are spaced apart from each other so that the corresponding gap 6 is illustrated substantially more enlarged, as compared to a gap of flange surfaces 9, 10 that are in contact with each other. The actual gap 6 is formed only when the corresponding joining surfaces 4, 5 of the flange surfaces 9, 10 pointing to each other of the housing parts 2, 3 are in contact with each other.

The gap 6 then has a certain length and also gap width, which satisfy the requirements for explosion-proof operating media.

FIG. 4 shows a top view of a housing 1 comprising housing parts 2 and 3 and corresponding flange surfaces 9, 10 analogously to FIG. 3 for an embodiment according to the invention.

In the region of the flange surfaces 9, 10 a surface profile 7, 8 extends in the profile direction 12. The surface profiles 7, 8 are formed in the region of the corresponding joining surfaces 4, 5, also see FIG. 5, which corresponds to a section along line V-V of FIG. 4.

It be pointed out once more that corresponding surface profiles 7, 8 may also be used for housing 1 according to FIG. 1, wherein the section according to FIG. 5 would, in this case, correspond to the section of line III-III according to FIG. 1.

It can further be seen in FIG. 4 that the surface profile 7, 8 of such a housing 1 with a rectangular cross-section, also see FIG. 5, is composed of different individual profiles both perpendicular to the longitudinal direction 18 and in the profile direction 12. The different individual profiles abut each other in corresponding corners of the housing 1, where they are connected with each other and merge with each other. In the direction perpendicular to the longitudinal direction 18 of the housing parts the corresponding individual profiles are arranged side by side and, for example, equally spaced apart from each other. In housings 1 having a circular cross-section the arrangement of the individual profiles may be analogous, which are then arranged concentrically relative to each other. It is also possible, however, as shown in FIG. 7, that the surface profiles are only formed of a spiral-shaped individual profile if the housing 1 has a circular cross-section.

In FIG. 5 it can particularly be seen that the surface profiles 7, 8 are formed by a corrugation, by spikes, teeth or the like, which project from the rest of the joining surfaces 4, 5 or are recessed in the same. For example, the corresponding surface profile 7 in housing part 2 is formed by recessed profile recesses 16, between which the profile crests 15, which end flush with the rest of the joining surface, extend.

In the other housing part 3 the surface profile 8 is formed by the profile crests 15 which project over the rest of the joining surface 5, between which profile recesses 16 are located which extend to the rest of the joining surface 5.

In the embodiment according to FIG. 5 a corresponding profile depth 13 and profile height 14 of the profile recesses 16 and the profile crests 15 of all individual profiles is identical both in the direction perpendicular to the longitudinal direction 18 of the housing and in the profile direction 12. It is also possible, however, to vary the profile depth and/or profile height in both directions in another embodiment.

In order to obtain a good engagement of the corresponding surface profiles 7, 8 with reproducible gap dimensions of the gap 6 and, at the same time, facilitate the production of the surface profiles 7, 8, the latter may be formed complementary with respect to each other in the housing parts 2 and 3. This is provided, for example, in the embodiment according to FIG. 5.

It be noted that it is likewise possible that the corresponding joining surfaces 4, 5 or flange surfaces 9, 10, respectively, are not arranged perpendicular to the longitudinal direction 18 of the housing, but extend inclined relative to this longitudinal direction at another angle. For example, flange surface 9 with the corresponding joining surface 4 and the surface profile 7 of FIG. 5 may extend obliquely upwardly, for example, at an angle of 60° between the longitudinal direction 18 of the housing and the flange surface 9. Analogously, flange surface 10 with the joining surface 5 and the surface profile 8 of the housing part 3 may extend obliquely upwardly at an angle of 120° relative to the longitudinal direction 18 of the housing of housing part 3. In this case, too, the corresponding surface profiles 7, 8 are engaged with each other by forming a corresponding flame-proof gap 6. As another example, as shown in FIG. 6, the flange surfaces 9, 10 of the embodiment shown in FIG. 3 can extend obliquely downward (rather than perpendicular to) the two respective housing parts 2, 3.

It is apparent that other inclinations of the flange surfaces 9, 10 relative to the corresponding housing parts are possible.

The surface profile according to the invention not only serves to form the corresponding gap 6, but simultaneously also serves to orientate and center the respective housing parts relative to each other. Thus, the surface profile according to the invention unites advantages of various previously known joining surfaces for housing parts and additionally has further advantages.

It be additionally noted that there is no necessity, for example, in the embodiment according to FIG. 4, that the corresponding individual profiles abut each other and merge with each other. In these regions also corresponding flat flange surfaces may be provided, see FIG. 3. This would simplify, for example, the detachable attachment of the housing parts 2 and 3 in these regions by fasteners 17. The fasteners 17 are here arranged in the region of the joining surfaces 4, 5, but outside the surface profiles 7, 8.

Moreover, it is possible that the inventive housing is provided, apart from surface profile 7, 8 according to FIGS. 4 and 5, with an additional screwed connection of the housing parts 2 and 3, if they are provided with a circular cross-section especially according to FIG. 1. Such a screwed connection may be provided in the region of parts of the housing parts 2 and 3 which are plugged into each other and are rotatable relative to each other.

The invention claimed is:

1. A housing (1) for an electrical operating medium, comprising:
   a first housing part (2) comprising a first joining surface (4) that extends substantially perpendicular relative to a first remainder of the first housing part (2), wherein the first joining surface (4) comprises a first surface profile (7) that is non-linear, wherein the first surface profile (7) is spiral-shaped in a profile direction (12);
   a second housing part (3) comprising a second joining surface (5) that extends substantially perpendicular relative to a second remainder of the second housing part (3), wherein the second joining surface (5) comprises a second surface profile (8) that is non-linear, wherein the second surface profile (8) is spiral-shaped in a profile direction (12),
   wherein the first surface profile (7) and the second surface profile (8), when the first housing part (2) and the second housing part (3) are assembled, without additional components, form a penetration-proof gap (6) to meet requirements for an explosion-proof enclosure,
   wherein the first surface profile (7) and the second surface profile (8) are formed complementary with respect to each other, and
   wherein the first joining surface (4) is joined with the second joining surface (5) when the first housing part (2) is coupled to the second housing part (3).

2. The housing according to claim 1, wherein the first joining surface (4) is formed as part of a first flange surface (9) projecting from the first housing part (2) in a substantially radially outward manner.

3. The housing according to claim 1, wherein the first joining surface (4) is formed to surround the first housing part (2).

4. The housing according to claim 1, wherein the first housing part (2) has a circular cross-section.

5. The housing according to claim 1, wherein the first housing part (2) is produced of a metal, specifically of light metal, at least in a region of the first joining surface (4).

6. The housing according to claim 1, wherein the first housing part (2) is produced of a plastic material at least in a region of the first joining surface (4).

7. The housing according to claim 5, wherein the first housing part has at least one coating of a plastic material.

8. The housing according to claim 1, wherein the first surface profile (7) is produced specifically by machining the first joining surface (4).

9. The housing according to claim 1, wherein the spiral-shaped first surface profile (7) has a substantially similar profile depth (13) as the spiral-shaped second surface profile (8) in the profile direction (12) along the shape of the spiral.

10. The housing according to claim 1, wherein the first housing part (2) and the second housing part (3) are connected to each other detachably in a region of the first joining surface (4) and the second joining surface (5), and specifically outside the first surface profile (7) and the second surface profile (8).

11. The housing according to claim 1, wherein the first surface profile (7) is projecting relative to the rest of the first joining surface (9).

12. The housing according to claim 1, wherein the first surface profile (7) is recessed relative to the rest of the first joining surface (4).

13. The housing according to claim 1, wherein the first surface profile (7) is sawtooth-shaped in the profile direction (12) along the shape of the spiral.

14. The housing according to claim 1, wherein the first surface profile (7) has a substantially similar profile height (14) as the second surface profile (8) perpendicular to the profile direction (12) along the shape of the spiral.

15. The housing according to claim 1, wherein the first housing part (2) with the first joining surface (4) is produced from a casting, and wherein the first surface profile (7) is produced simultaneously with the first housing part (2) and the first joining surface (4) during the casting.

* * * * *